(12) United States Patent
Chen et al.

(10) Patent No.: US 11,977,324 B1
(45) Date of Patent: May 7, 2024

(54) MODIFYING SEGMENTS AND VERTICES OF MASK SHAPES FOR MASK SYNTHESIS

(71) Applicant: Synopsys, Inc., Mountain View, CA (US)

(72) Inventors: Yung-Yu Chen, Hsinchu (TW); Lun-Wen Yeh, Tainan (TW)

(73) Assignee: Synopsys, Inc., Sunnyvale, CA (US)

( * ) Notice: Subject to any disclaimer, the term of this patent is extended or adjusted under 35 U.S.C. 154(b) by 227 days.

(21) Appl. No.: 17/584,279

(22) Filed: Jan. 25, 2022

(51) Int. Cl.
*G03F 1/36* (2012.01)
*G03F 1/70* (2012.01)
(52) U.S. Cl.
CPC . *G03F 1/36* (2013.01); *G03F 1/70* (2013.01)
(58) Field of Classification Search
CPC .................................... G03F 1/36; G03F 1/70
USPC ............................................................. 430/5
See application file for complete search history.

(56) References Cited

U.S. PATENT DOCUMENTS 7,313,780 B2 * 12/2007 Khoh ........................ G03F 1/36
716/55

* cited by examiner

*Primary Examiner* — Christopher G Young
(74) *Attorney, Agent, or Firm* — Fenwick & West LLP (57) ABSTRACT

In some aspects, a mask shape is represented by vertices that are connected by segments. A correction to the mask shape is received. The correction may include displacements of the segments and displacements of the vertices. The mask shape is modified by a processor, as follows. The segments are moved according to the segment displacements. As part of this process, vertices that are endpoints of the moved segments are replicated. The replicated vertices are then collapsed. The resulting vertices are then moved according to the vertex displacements. This process of modifying the mask shape may be used as part of a mask synthesis process, to synthesize or correct the mask shapes according to some desired result.

20 Claims, 12 Drawing Sheets

MODIFYING SEGMENTS AND VERTICES OF MASK SHAPES FOR MASK SYNTHESIS

TECHNICAL FIELD

The present disclosure generally relates to lithography modeling and mask synthesis, including for extreme ultraviolet (EUV) masks. In particular, the present disclosure relates to a system and method for modifying a segment and a vertex for a mask shape for mask synthesis.

BACKGROUND

One step in the manufacture of semiconductor wafers involves lithography. In a typical lithography process, a source produces light that is collected and directed by collection/illumination optics to illuminate a lithographic mask. Projection optics relay the pattern produced by the illuminated mask onto a wafer, exposing resist on the wafer according to the illumination pattern. The patterned resist is then used in a process to fabricate structures on the wafer.

Various technologies are directed to improving the lithography process, including the design of the lithographic mask. In many of these technologies, the current design of the lithographic mask is used as an input to a process model, which then predicts some process result. The mask design may be represented by the different shapes on the mask, for example shapes representing transparent or opaque regions of the mask. This representation is used in computational models that predict various stages of the lithography process, such as the electromagnetic field resulting from illumination of the mask by a source, the aerial image produced by the projection optics to expose resist on a wafer and/or the resulting patterned resist or features on the wafer.

SUMMARY

In some aspects, a mask shape is represented by vertices that are connected by segments. A correction to the mask shape is received. The correction may include displacements of the segments and displacements of the vertices. The mask shape is modified by a processor, as follows. The segments are moved according to the segment displacements. As part of this process, vertices that are endpoints of the moved segments are replicated. The replicated vertices are then collapsed. The resulting vertices are then moved according to the vertex displacements. This process of modifying the mask shape may be used as part of a mask synthesis process, to synthesize or correct the mask shapes according to some desired result.

Other aspects include components, devices, systems, improvements, methods, processes, applications, computer readable mediums, and other technologies related to any of the above.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to modifying segments and vertices of mask shapes for mask synthesis. Mask synthesis is a process for synthesizing and/or correcting the design of lithographic masks used in the fabrication of integrated circuits. The mask design is typically represented as a set of shapes. The set of shapes are used as input to computational models that predict different stages of the lithography process. For example, the models may predict that a certain mask shape will result in a certain printed pattern on the semiconductor wafer. If the predicted result does not match the desired result, then the mask shape may be changed accordingly.

Mask shapes may be represented as a set of vertices connected by segments. Each segment has two vertices as endpoints. Corrections to the mask shape may be represented as displacements of the segments and/or displacements of the vertices, where in both cases the displacements are along predetermined directions. For segment displacements, the predetermined direction is usually normal to the segment. For vertex displacements, the predetermined direction is usually the bisector of the angle formed by the two segments that connect to the vertex.

However, conventional approaches to implementing corrections defined in this manner can result in the proliferation of vertices and segments. For example, when a segment is displaced by a certain amount, each of the two endpoint vertices of that segment is displaced and will no longer be in the same location as the endpoint vertex of the adjacent segment. A conventional approach is to replicate that endpoint vertex. For example, before displacement, segment A-B may be connected to segment B-C at vertex B. After segment A-B is displaced, the B endpoints of the two segments are now at different locations. Effectively, the B vertex is replicated as a pair of vertices, that may be referred to as vertices B1 and B2. The two segments A-B1 and B2-C are no longer connecting. Segment A-B1 does not connect to segment B2-C, because B1 and B2 are displaced relative to each other. Accordingly, an additional segment B1-B2 is added to join the two vertices B1-B2. However, this can result in a staircase effect. For example, an angled line or curve may be represented by a series of short horizontal and vertical segments.

In the present system and method described herein, this proliferation of vertices and segments is mitigated by collapsing the replicated vertices into a single vertex. In the example above, the vertices B1 and B2 are collapsed to a single vertex B' so there is no need to introduce an additional segment. Rather, the two segments A-B' and B'-C still connect, but at collapsed vertex B'. The vertices are described as collapsed, because the extra segment B1-B2 is collapsed, which results in merging the two vertices B1 and B2 into vertex B'.

This is advantageous because it reduces or even avoids the proliferation of vertices and segments. Many approaches to mask synthesis consider the effect of each vertex and/or segment on the desired result. Increasing the number of vertices and segments increases the computational load, since more vertices and segments must be considered. Increasing the number of vertices and segments also increases the amount of data storage and communication bandwidth required to handle the increased amount of data. Reducing the proliferation of vertices and segments therefore reduces these unwanted effects.

This approach can also result in smoother mask shapes, instead of jagged, staircase representations of edges. This is also advantageous because staircase representations can be more difficult and computationally intensive to simulate. Many simulation models operate better with smoother or continuous shapes, so a staircase representation can be more problematic. They can also result in less accurate simulation results. Accordingly, they may also be more difficult to optimize and may converge to a solution more slowly.

Figure 1:
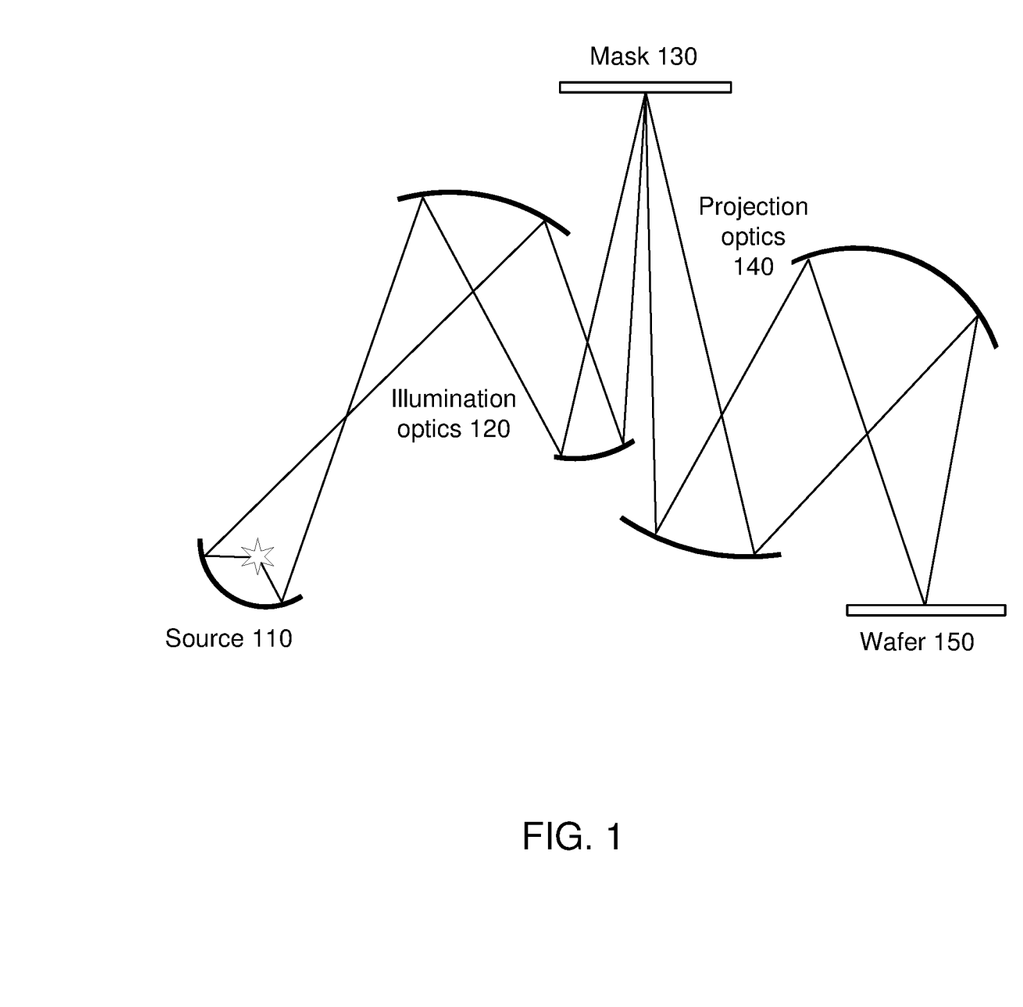
FIG. 1 illustrates an EUV lithography system, according to one embodiment of the present disclosure.

In more detail, FIG. 1 illustrates an extreme ultraviolet (EUV) lithography system, according to one embodiment of the present disclosure. In this system, a source 110 produces EUV light that is collected and directed by collection/illumination optics 120 to illuminate a lithographic mask 130. Projection optics 140 relay the pattern produced by the illuminated mask onto a wafer 150, exposing resist on the wafer according to the illumination pattern. The exposed resist is then developed, producing patterned resist on the wafer. This is used to fabricate structures on the wafer, for example through deposition, doping, etching or other processes.

In FIG. 1, the light is in the EUV wavelength range, around 13.5 nm or in the range 13.3-13.7 nm. At these wavelengths, the components typically are reflective, rather than transmissive. The mask 130 is a reflective mask and the optics 120, 140 are also reflective and off-axis. This is just an example. Other types of lithography systems may also be used, including at other wavelengths, using transmissive masks and/or optics, and using positive or negative resist.

Figure 2A:
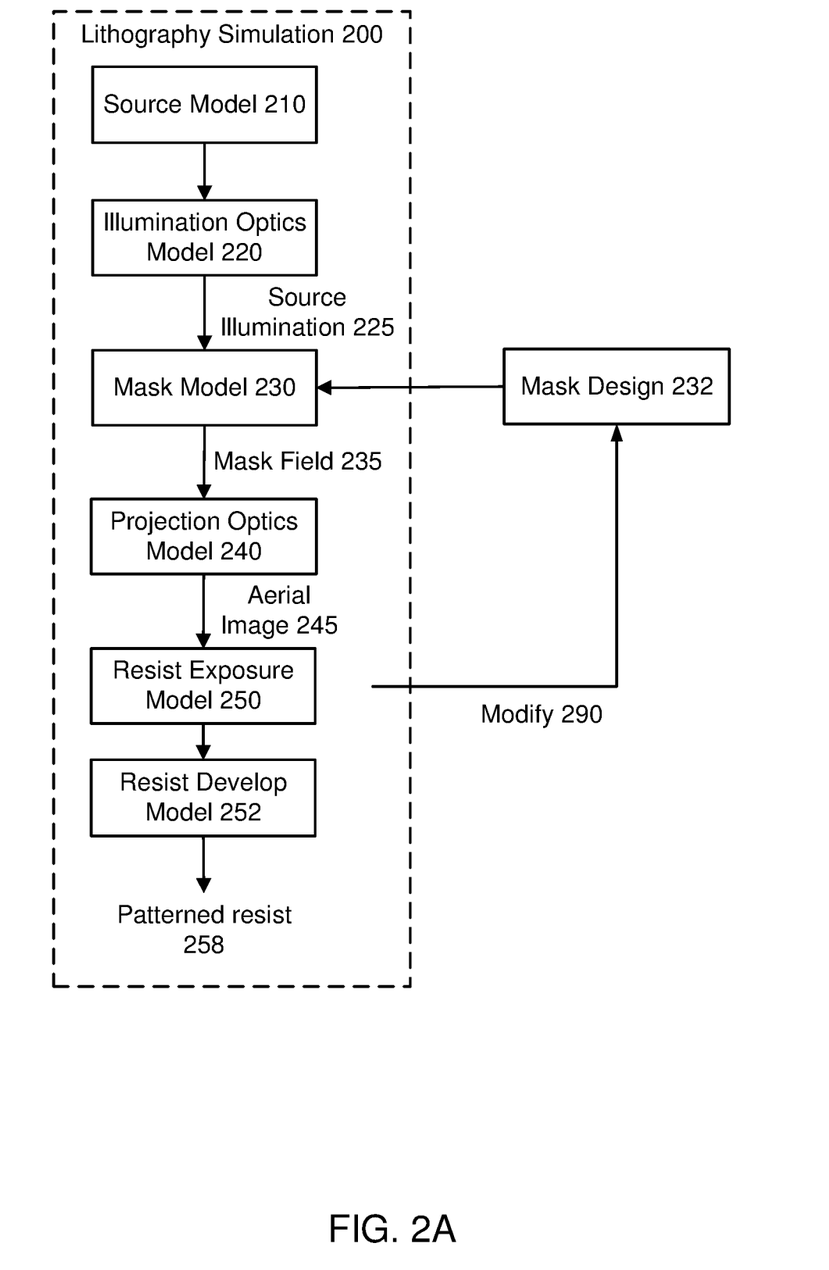
FIG. 2A illustrates a flowchart for modeling a lithography process, including modifying a design of a lithographic mask, according to one embodiment of the present disclosure.

FIG. 2A illustrates a flowchart for modeling a lithography process, including modifying a design of a lithographic mask, according to one embodiment of the present disclosure. The dashed box includes simulations or models 200 of the overall lithography configuration. For convenience, separate boxes are shown to correspond to physical components or processes, but the simulations need not be implemented in this way. For example, source model 210 represents a model of the source 110 and illumination optics models 220 models the effect of illumination optics 120. These are used to predict the source illumination 225 incident on the mask. However, actual simulation may or may not use separate models 210, 220 for the source and optics. In some cases, the two may be combined into a single model or simulation that predicts the source illumination 225.

Mask model 230 models the effect of the mask 130 on the incident illumination 225. Here, the mask 130 is represented by mask design 232. Projection optics model 240 represents the effect of optics 140. The source illumination 225 is filtered by mask model 230. The resulting field is referred to as the mask field 235. This is relayed by projection optics 240 to produce the aerial image 245 that exposes the resist on the wafer. The resist is modeled by a resist exposure model 250 and a resist development model 252, resulting in patterned resist 258. Additional modeling may be used to predict etching, doping, deposition or other semiconductor fabrication processes.

Various results of the lithography simulation 200 may be used to modify 290 the mask design 232. For example, the predicted mask field 235 may be analyzed and then used to modify 290 the mask design 232. The aerial image 245 and patterned resist 258 may also be used for this purpose.

Metrics derived from these quantities may also be used. One example of a metric is the difference between the predicted aerial image 245 and a desired aerial image. Differences between other predicted signals (e.g., the mask field 235) and the desired signal may also be used. Differences between the predicted locations of the edges of the patterned resist 258 and the desired locations of those edges is another example. This may be referred to as edge placement error.

As another example, one measure of the quality of patterned resist 258 is the critical dimension (CD). CD is the dimension of certain features in the patterned resist. Typically, the CD is the smallest line width or space width printed in the resist. As such, it is a measure of the resolution of the resist and lithography process. The models 200 may be used to predict the CDs for a given lithography configuration. The predicted CD may be used to modify 290 the mask design 232.

Another measure of the quality of patterned resist 258 is defects. Examples of defects include when two printed lines that are supposed to be separate are merged, when a printed line that is supposed to be continuous has a break, and when a printed feature that is supposed to have a hole in the center is actually filled in. Predicted defects and defect rate may also be used to modify 290 the mask design 232. Other metrics may be based on the differences between a desired and a predicted result.

Figure 2B:
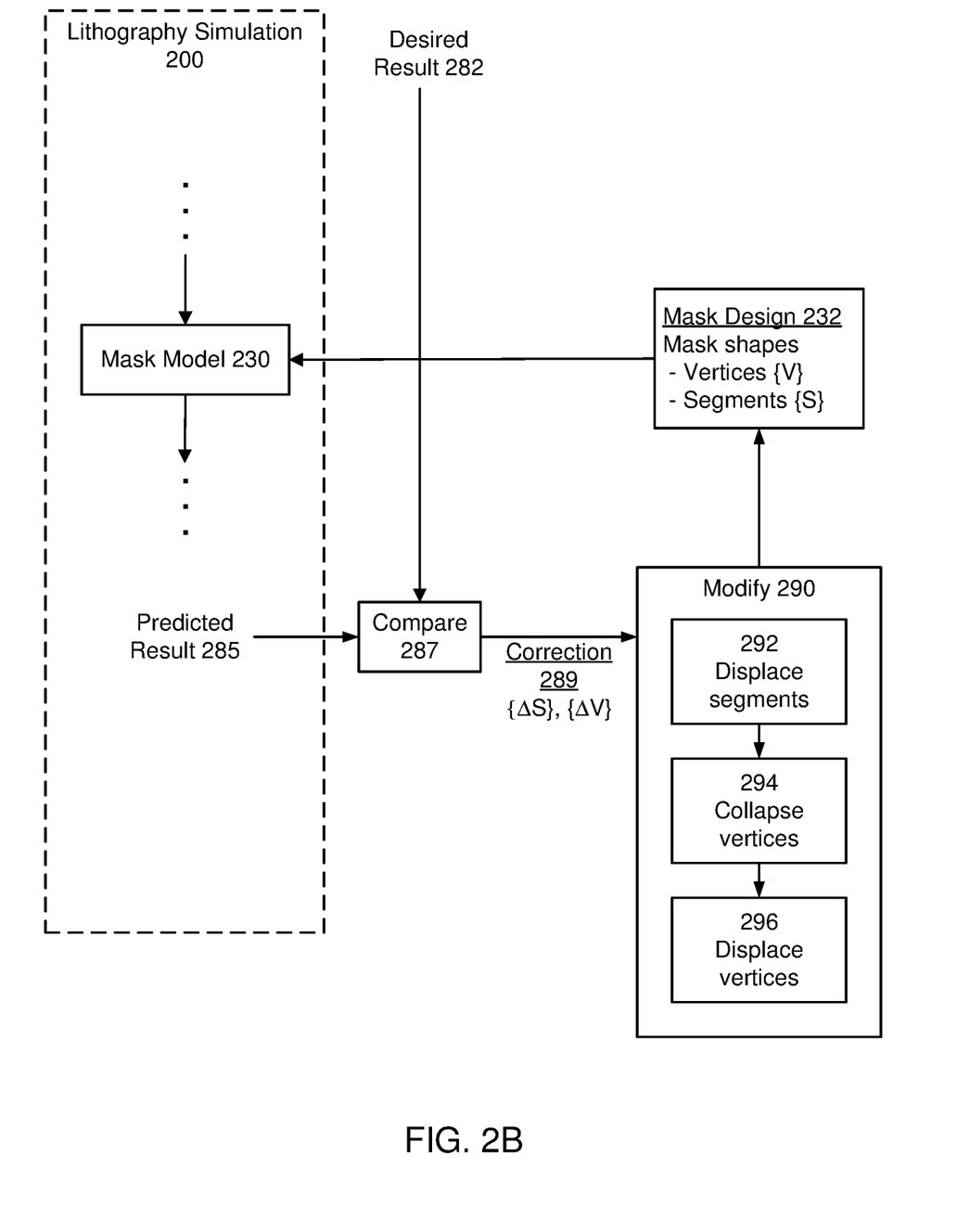
FIG. 2B illustrates a flowchart for modifying a mask design, according to one embodiment of the present disclosure.

FIG. 2B illustrates a flowchart for modifying a mask design, according to one embodiment of the present disclosure. In one embodiment, the flowchart of FIG. 2B provides more details related to the modifying step 290 as shown in FIG. 2A. In the example of FIG. 2B, the mask design 232 is represented by mask shapes. For example, an EUV lithographic mask may be represented by a stack of multiple layers of different materials, where each layer has shapes representing different materials. The mask shapes are represented by vertices {V} connected by segments {S}. The mask model 230 uses the mask shapes, and the lithography simulation 200 predicts some result 285 using the mask model 230 and design 232. The lithography result 285 could be any of the metrics described previously.

At 287, the predicted lithography result 285 is compared to a desired result 282, yielding a correction 289 to the mask design. The correction 289 is expressed as displacements to the segments { $\Delta S$ } and displacements to the vertices { $\Delta V$ }. In some cases, the result 285 is a performance metric or cost function M. The design goal may be to minimize or maximize the metric M. Some form of gradient descent optimization may be used, based on the gradients $\partial M/\partial S$ and $\partial M/\partial V$ for the locations of the different segments and vertices. $\partial M/\partial S$ is the sensitivity of the metric M with respect to displacement of segment S along a predetermined direction (e.g., normal to the segment). $\partial M/\partial V$ is the sensitivity of the metric M with respect to displacement of vertex V along a predetermined direction. The corrections { $\Delta S$ } and { $\Delta V$ } may then be determined based on the gradients $\partial M/\partial S$ and $\partial M/\partial V$.

At 290, the mask design 232 is modified as follows. At 292, the segments defining the mask shapes are moved according to the segment displacements { $\Delta S$ }. As described in more detail below, moving the segments results in replicating vertices that are endpoints of the moved segments. At 294, these replicated vertices are then collapsed. For example, if moving a segment replicates a single vertex as a pair of vertices, the pair of replicated vertices may be collapsed back into a single vertex at 294. At 296, the collapsed vertices are then further moved according to the vertex displacements { $\Delta V$ }. Vertices which were not affected by segment displacement may also be moved.

The resulting modified design 232 is then used as input to the mask model 230, and the process is repeated iteratively until the desired lithography result 282 is achieved, such as a desired aerial image, resist pattern, or critical dimension.

Figure 3A:
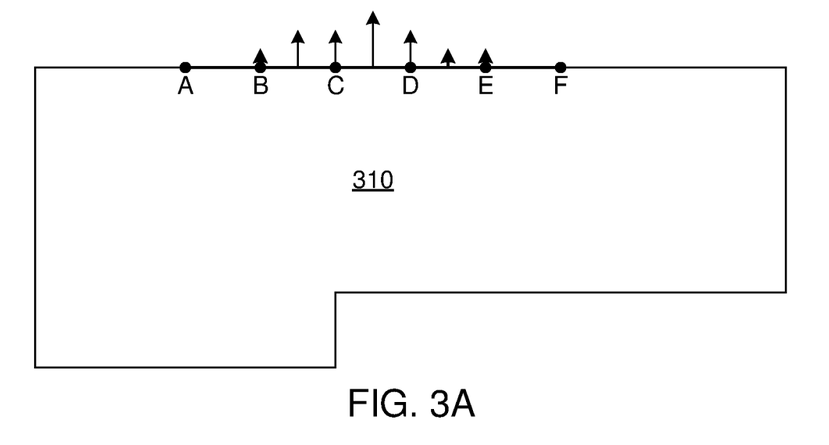
FIGS. 3A-3D illustrate an example of a process for modifying a mask design, according to one embodiment of the present disclosure.

FIGS. 3A-3D illustrate an example of a process for modifying a mask design, according to one embodiment of the present disclosure. This example shows a single mask shape 310. The mask shape 310 is decomposed into multiple vertices connected by segments. In particular, the top edge of the mask shape is subdivided into multiple segments. FIG. 3A shows five segments connecting vertices A-F. The segments are labelled by their endpoint vertices: segments A-B, B-C, etc. The example of FIG. 3 focuses on the middle three segments (B-C, C-D, and D-E) and their connecting vertices B to E. The correction to the mask shape includes displacements of segments B-C, C-D, D-E and also displacements of vertices B, C, D, E, as indicated by the arrows in FIG. 3A. For purposes of illustration, there are no displacements of segments A-B, E-F or vertices A, F.

Figure 3B:
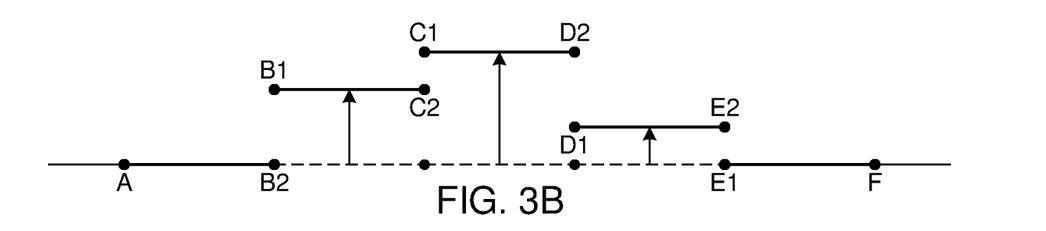

In FIG. 3B, the three middle segments are moved according to their corrective displacements (as shown in step 292 in FIG. 2B). The dashed lines show the locations of the segments before displacement, and the solid lines show the segments after displacement. Each segment is displaced along a direction normal to the segment, as indicated by the arrows. Since the segments are displaced by different amounts, the segments are no longer aligned and do not connect at their endpoints. For example, prior to segment movement, segments A-B and B-C connected at vertex B (see FIG. 3A). After segment movement, the right endpoint of segment A-B no longer touches the left endpoint of segment B-C. The single vertex B is replicated as two vertices B1 and B2. The same occurs for vertices C, D, E. In a traditional approach, the gaps in the edge of the mask shape may be closed by adding segments B1-B2, C1-C2, etc. However, this results in a proliferation of the number of vertices and segments and also results in a staircase representation of edges.

Figure 3C:
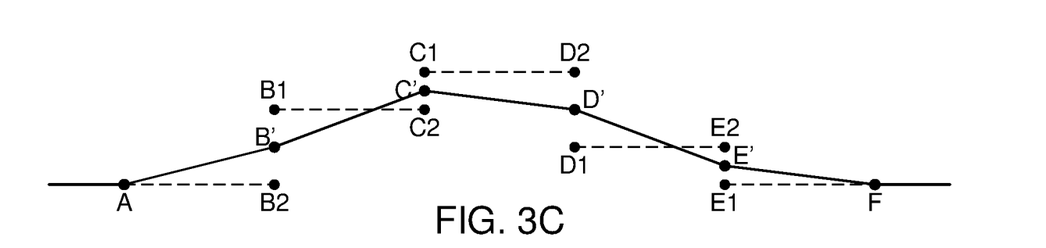

Here, the replicated vertices are collapsed, as shown in FIG. 3C. The dashed lines show the segments before the vertices are collapsed, and the solid lines show the segments after the vertices are collapsed. For example, the replicated vertices B1 and B2 are collapsed into vertex B', which is located at the midpoint between B1 and B2. The same approach yields collapsed vertices C', D', E'. After collapsing the replicated vertices, the segments are A-B', B'-C', C'-D', D'-E', E'-F. Collapsing the replicated vertices reduces the number of segments and vertices. In this example, the mask shape has a same number of vertices after modification as before modification.

Figure 3D:
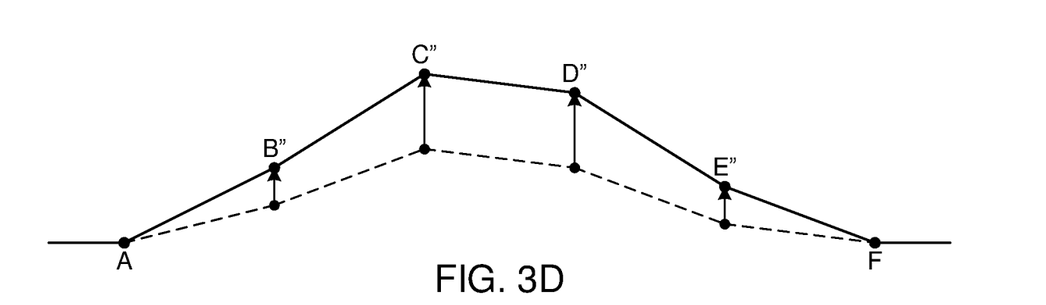

The vertex displacements are then applied (as shown in step 296 in FIG. 2B). In FIG. 3D, the dashed lines show the segments before the corrective vertex displacement, and the solid lines show the segments after vertex displacement. The vertex displacements are shown by the arrows. The vertices B' to E' are moved to locations B'' to E'' according to the received corrective displacements.

Figure 4:
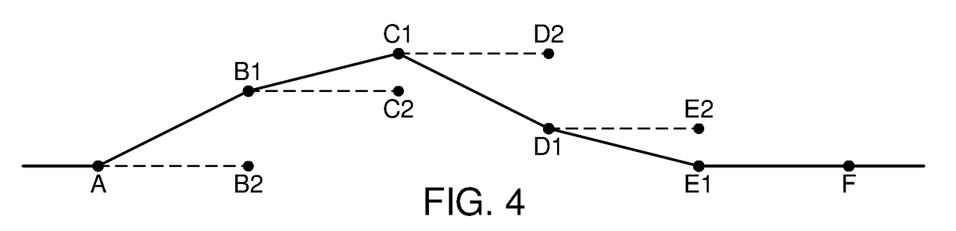
FIG. 4 illustrates an example diagram for collapsing replicated vertices, according to one embodiment of the present disclosure.

In FIG. 3, the replicated vertices were collapsed to the midpoint between the replicated vertices. Other approaches may also be used as follows. FIG. 4 illustrates an example diagram for collapsing replicated vertices, according to one embodiment of the present disclosure. FIG. 4 shows the same situation as FIG. 3C, but the replicated vertices are collapsed to the left endpoint of each segment (or the counterclockwise endpoint if considering the entire mask shape). For example, the replicated vertex B2 is collapsed or merged into the replicated vertex B1, which is the left endpoint of the segment B1-C2.

Figure 5:
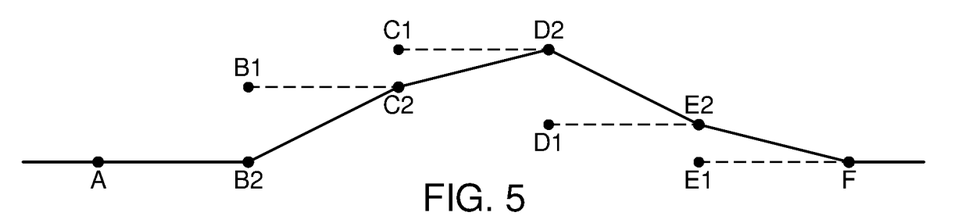
FIG. 5 illustrates another example diagram for collapsing replicated vertices, according to one embodiment of the present disclosure.

FIG. 5 illustrates another example diagram for collapsing replicated vertices, according to one embodiment of the present disclosure. In FIG. 5, the replicated vertices are collapsed to the right endpoint of each segment. For example, the replicated vertex B1 is collapsed or merged into the replicated vertex B2, which is the right endpoint of the respective segment A-B2. In both of these situations shown in FIG. 4 and FIG. 5, each pair of replicated vertices is collapsed to one of the pair, rather than creating a vertex at a new location as in FIG. 3C.

Figure 6:
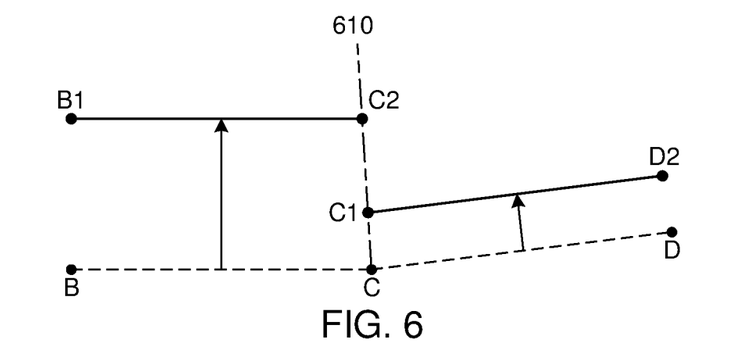
FIG. 6 illustrates an example diagram for modifying a mask design where adjacent segments are not collinear, according to one embodiment of the present disclosure.
Figure 7:
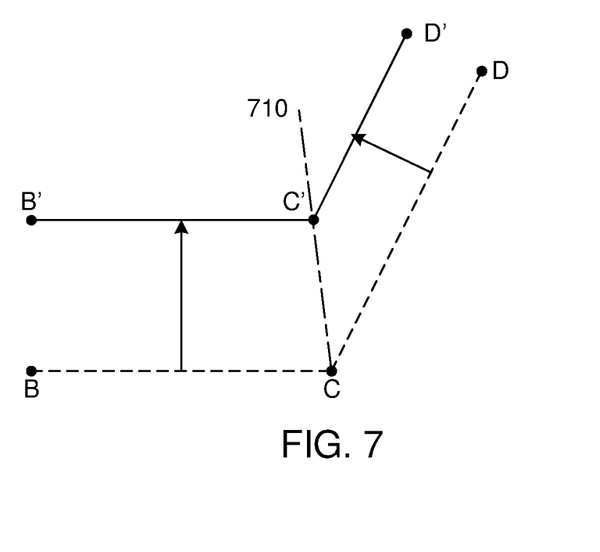
FIG. 7 illustrates another example diagram for modifying a mask design where adjacent segments are not collinear, according to one embodiment of the present disclosure.
Figure 8:
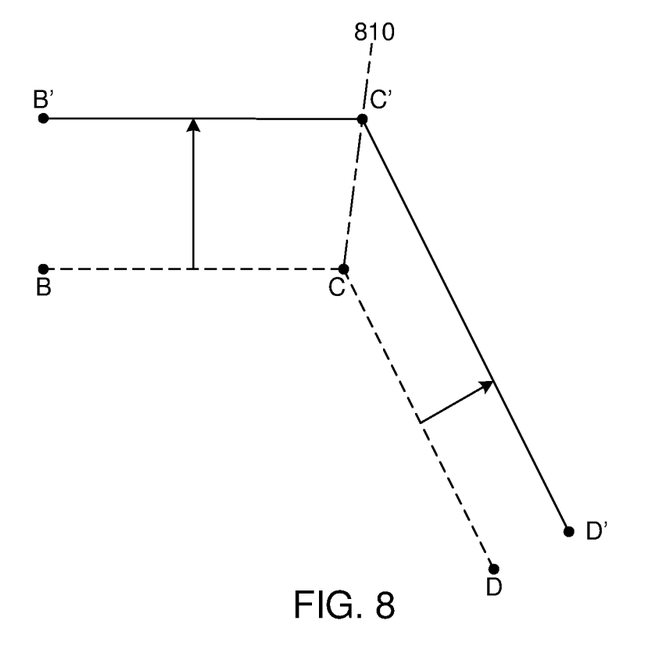
FIG. 8 illustrates another example diagram for modifying a mask design where adjacent segments are not collinear, according to one embodiment of the present disclosure.

In FIGS. 3-5, the adjacent segments were collinear before they were modified. FIGS. 6-8 show situations where that is not the case. FIG. 6 illustrates an example diagram for modifying a mask design where adjacent segments are not collinear. In FIG. 6, adjacent segments B-C and C-D are close to collinear but not exactly collinear. FIG. 6 shows displacement of these two segments to new locations B1-C2 and C1-D2. Dashed line 610 is the bisector of angle BCD. The two replicated vertices C1, C2 may be collapsed to various points along the bisector, for example to point C1, to point C2 or to a midpoint between C1 and C2.

FIGS. 7-8 illustrates another example diagram for modifying a mask design where adjacent segments are not collinear, according to some embodiments of the present disclosure. FIGS. 7 and 8 show situations where the adjacent segments are more angled and less collinear. These may be considered to be corners. The adjacent segments B-C and C-D form inside and outside corners in FIG. 7 and FIG. 8. In one approach, the collapsed vertex could be located along the bisector of angle BCD, as in FIG. 6. Alternatively, as shown in the figures, the collapsed vertex could be located at the intersection C' of the two displaced segments B'-C' and C'-D'.

Vertex displacement occurs after segment displacement and collapsing replicated vertices. In FIGS. 6-8, the vertex displacement could also be along the angle bisector (FIG. 6). Alternatively, vertex C' may be displaced along the direction defined by points C and C'. This is along direction 610 in FIG. 6, along direction 710 in FIG. 7 and along direction 810 in FIG. 8. Vertex C is the connecting point between the two adjacent segments before segment displacement, and vertex C' is the connecting point after segment displacement. Vertex displacement could also be along user-defined directions.

Figure 9A:
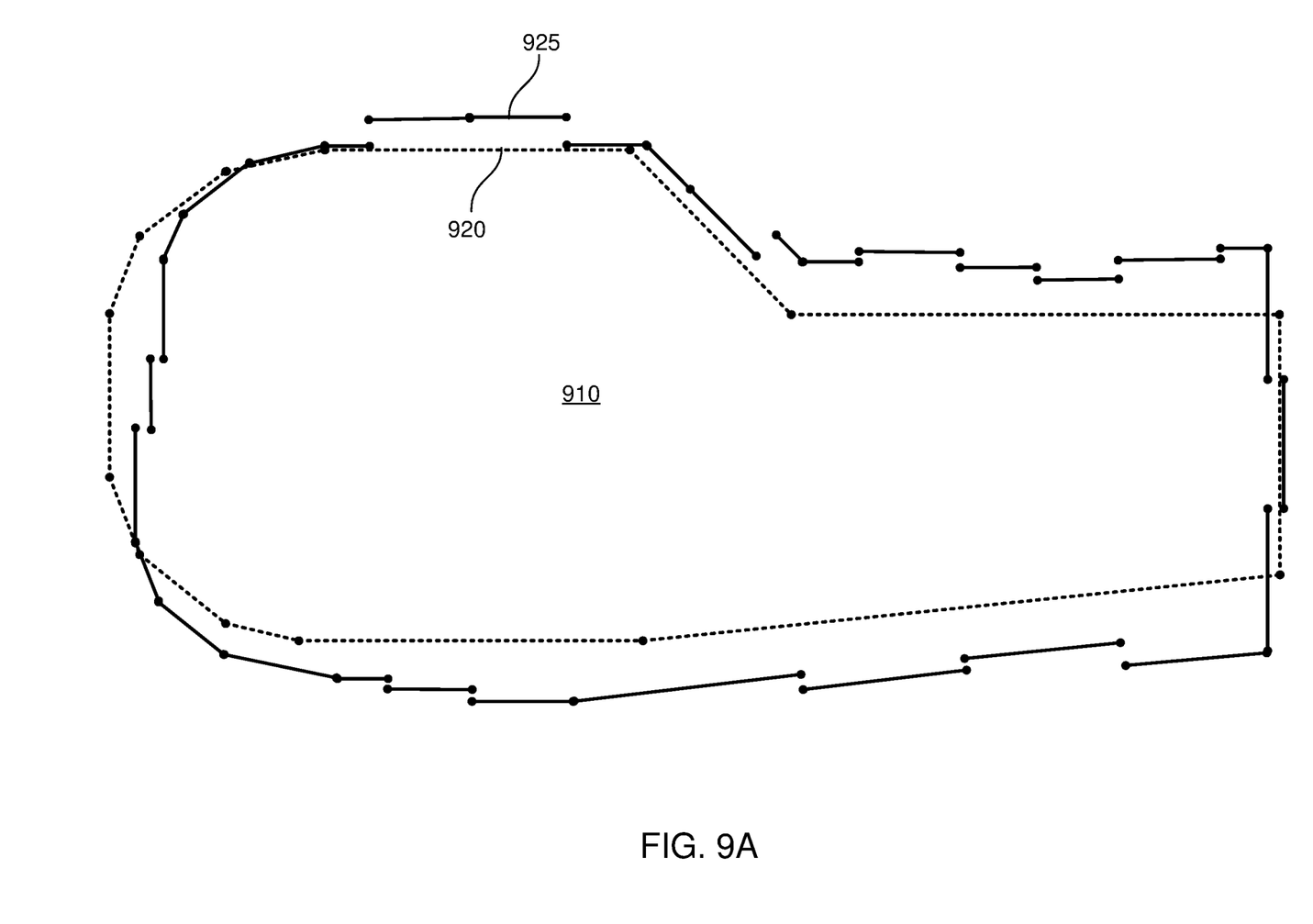
FIG. 9A illustrates another example diagram for modifying a mask design, according to one embodiment of the present disclosure.
Figure 9B:
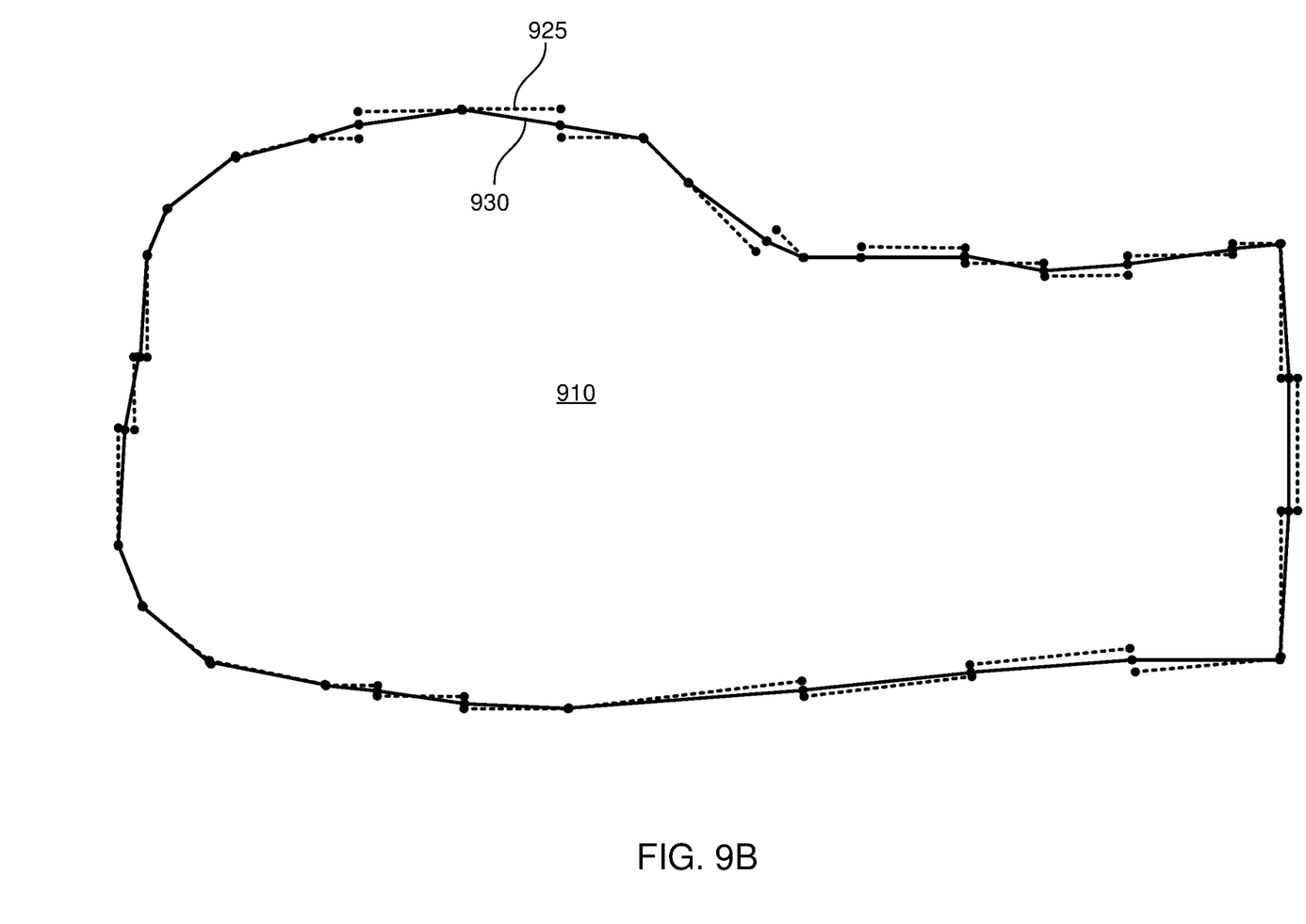
FIG. 9B illustrates another example diagram for modifying a mask design, according to one embodiment of the present disclosure.
Figure 9C:
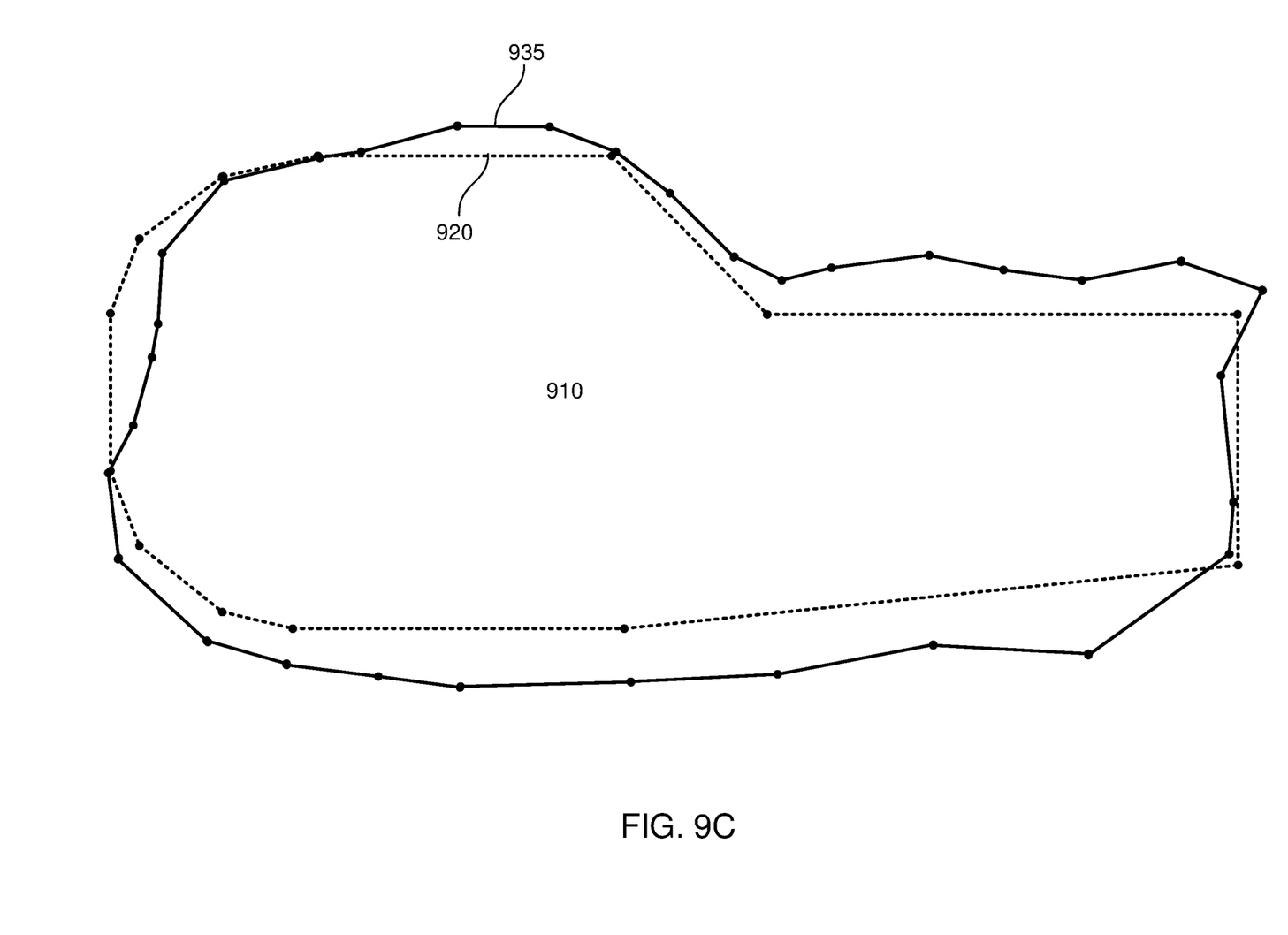
FIG. 9C illustrates another example diagram for modifying a mask design, according to one embodiment of the present disclosure.

FIGS. 9A-9C illustrate another example diagram for modifying a mask design, according to some embodiments of the present disclosure. FIGS. 9A-9C show the entire mask shape 910. FIG. 9A shows the step of displacing of segments. The dashed line 920 is the mask edge before modification. The solid line 925 shows the displacement of segments. Note that some of the dashed edges are subdivided into multiple segments. The replicated vertices are visible in FIG. 9A as gaps in the solid line.

FIG. 9B shows collapsing of replicated vertices. The displaced segments 925 are shown as dashed in this figure. The solid lines 930 show the segments after the replicated vertices have been collapsed.

FIG. 9C is another example that shows only vertex displacement. The dashed line 920 is the same mask edge as in FIG. 9A. The solid line 935 shows the mask edge after the vertices have been displaced.

In the situations described above, the vertices do not have to be expressly replicated and then collapsed. Instead, steps 292 and 294 in FIG. 2B may be combined into a single step by calculating the final vertex position based on segment displacement plus collapsing replicated vertices. For example, in FIG. 3, the vertex positions B', C', D', E may be determined by taking the midpoint of the displacements leading to B1-B2 and other replicated pairs. This may also be combined with the vertex displacements 296, yielding a final vertex position in a single calculation. For example, the net displacement of vertex C may be calculated based on the average of the segment displacements for segments B-C and C-D, plus the vertex displacement for vertex C.

The approach described above has the capability to handle Manhattan geometry mask shapes, crimped geometry mask shapes and any-angle geometry masked shapes. Simpler mask designs may be restricted to Manhattan geometry which allows only horizontal and vertical edges, or crimped geometry which also allows edges at 45 degree increments. The capability to handle these mask shapes is useful for backwards compatibility. Other mask designs may use any-angle geometry, where the edges may be oriented at any angle or discretized to relatively small increments (e.g., 1 degree or 5 degree increments).

Figure 10:
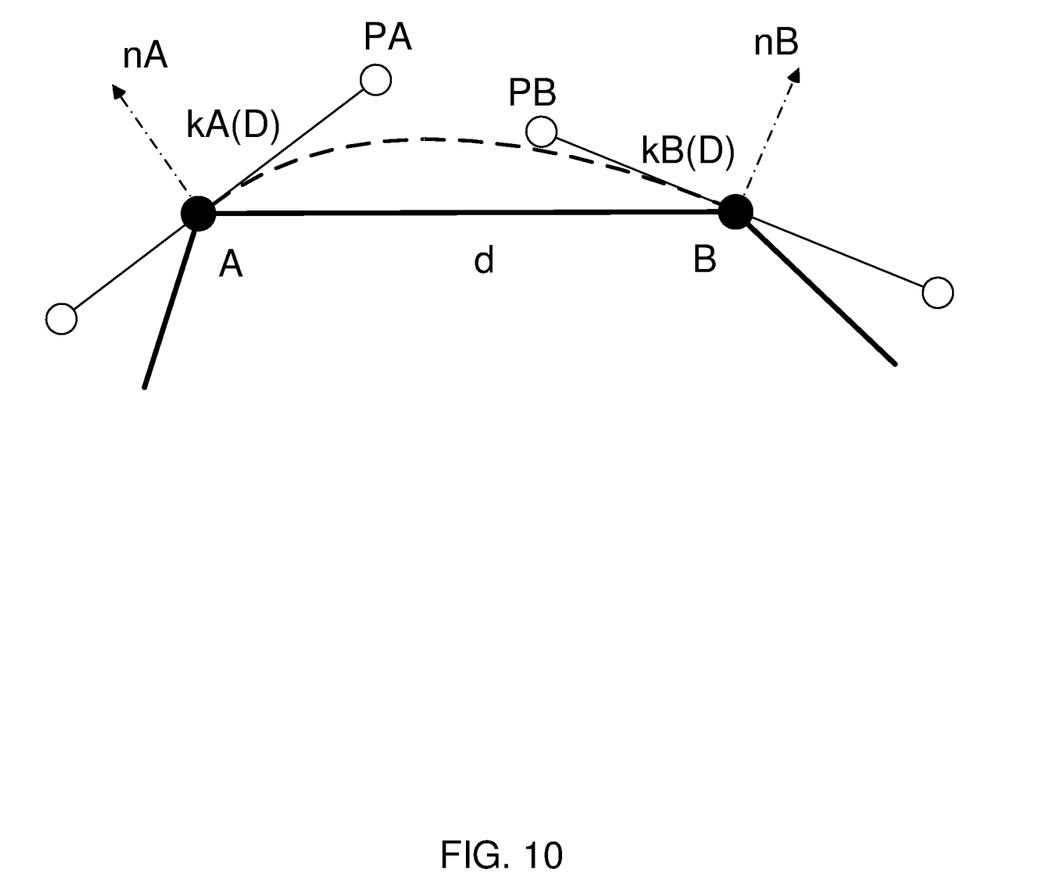
FIG. 10 illustrates an example diagram of a curved mask shape based on a segment and vertices, according to one embodiment of the present disclosure.

In some cases, the vertices and segments may be used to define curved edges for the mask shapes. FIG. 10 shows a cubic Bezier curve, although other curves may also be used. The Bezier curve is the dashed line connecting vertices A and B. The parameters for the cubic Bezier curve are the endpoints A, B and the handles PA, PB. Both the dashed Bezier curve and the corresponding black line segment A-B may be tangible entities for manipulation and may interact in a coupled way. The Bezier curve is controlled by using the vertices A, B and the handles PA, PB. These define the distance d, the coefficients kA, kB and the tangential directions nA and nB at the vertices A, B. The choice of curve formula may be the cubic Bezier curve or other forms that accept the control points. The explicit equation of the cubic Bezier curve (dashed line) is:

$$B(t)=(1-t)^3 A+3(1-t)^2 t P_A+3(1-t)t^2 P_B+t^3 B, \quad 0 \le t \le 1 \quad (1)$$

Automated software may change the curve by changing location of the control points A, B, PA and PB.

Another advantage of the approach described herein is that it can be parallelized. The mask design may include many mask shapes, and each mask shape may include many segments and vertices. In many cases, the mask shapes may be processed in parallel. The segments and vertices may also be processed in parallel.

Figure 11:
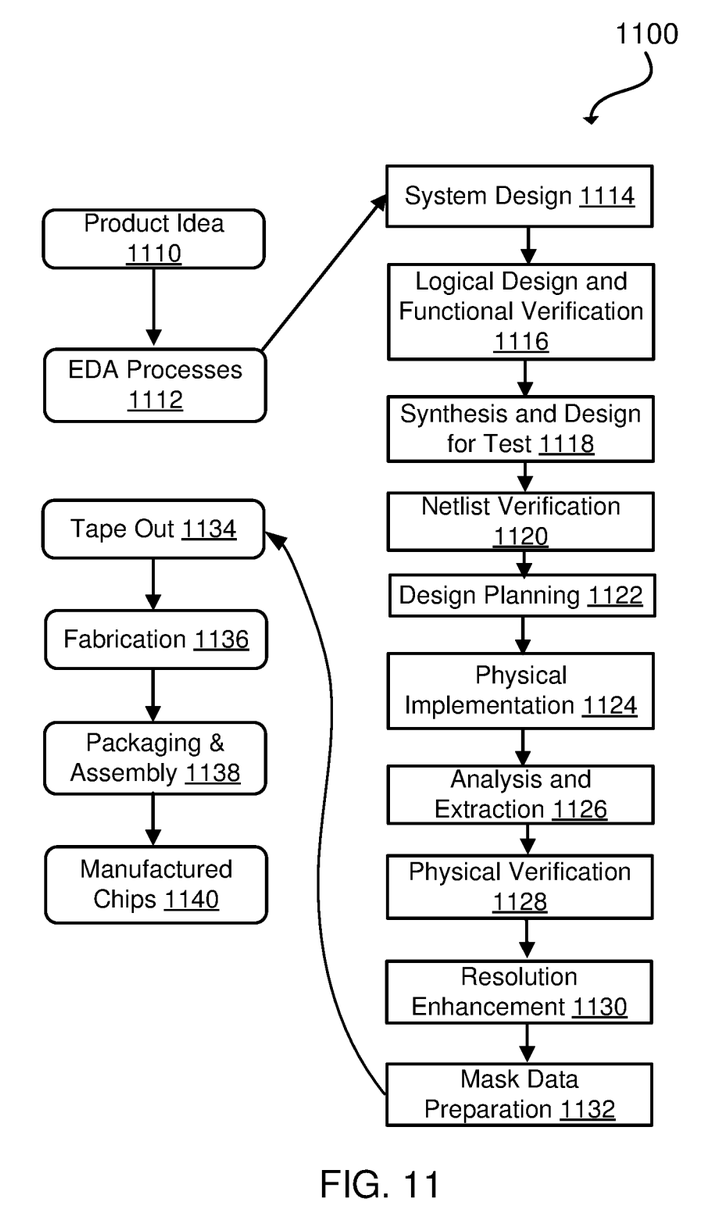
FIG. 11 depicts a flowchart of various processes used during the design and manufacture of an integrated circuit in accordance with some embodiments of the present disclosure.

FIG. 11 illustrates an example set of processes 1100 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1110 with information supplied by a designer, information which is transformed to create an article of manufacture that uses a set of EDA processes 1112. When the design is finalized, the design is taped-out 1134, which is when artwork (e.g., geometric patterns) for the integrated circuit is sent to a fabrication facility to manufacture the mask set, which is then used to manufacture the integrated circuit. After tape-out, a semiconductor die is fabricated 1136 and packaging and assembly processes 1138 are performed to produce the finished integrated circuit 1140.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 11. The processes described by be enabled by EDA products (or tools).

During system design 1114, functionality of an integrated circuit to be manufactured is specified. The design may be optimized for desired characteristics such as power consumption, lithography result, area (physical and/or lines of code), and reduction of costs, etc. Partitioning of the design into different types of modules or components can occur at this stage.

During logic design and functional verification 1116, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1118, HDL code is transformed to a netlist. In some embodiments, a netlist may be a graph structure where segments of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1120, the netlist is checked for compliance with timing constraints and for correspondence with the HDL code. During design planning 1122, an overall floor plan for the integrated circuit is constructed and analyzed for timing and top-level routing.

During layout or physical implementation 1124, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1126, the circuit function is verified at the layout level, which permits refinement of the layout design. During physical verification 1128, the layout design is checked to ensure that manufacturing constraints are correct, such as DRC constraints, electrical constraints, lithographic constraints, and that circuitry function matches the HDL design specification. During resolution enhancement 1130, the geometry of the layout is transformed to improve how the circuit design is manufactured.

During tape-out, data is created to be used (after lithographic enhancements are applied if appropriate) for production of lithography masks. During mask data preparation 1132, the 'tape-out' data is used to produce lithography masks that are used to produce finished integrated circuits.

A storage subsystem of a computer system (such as computer system 1200 of FIG. 12) may be used to store the programs and data structures that are used by some or all of the EDA products described herein, and products used for development of cells for the library and for physical and logical design that use the library.

Figure 12:
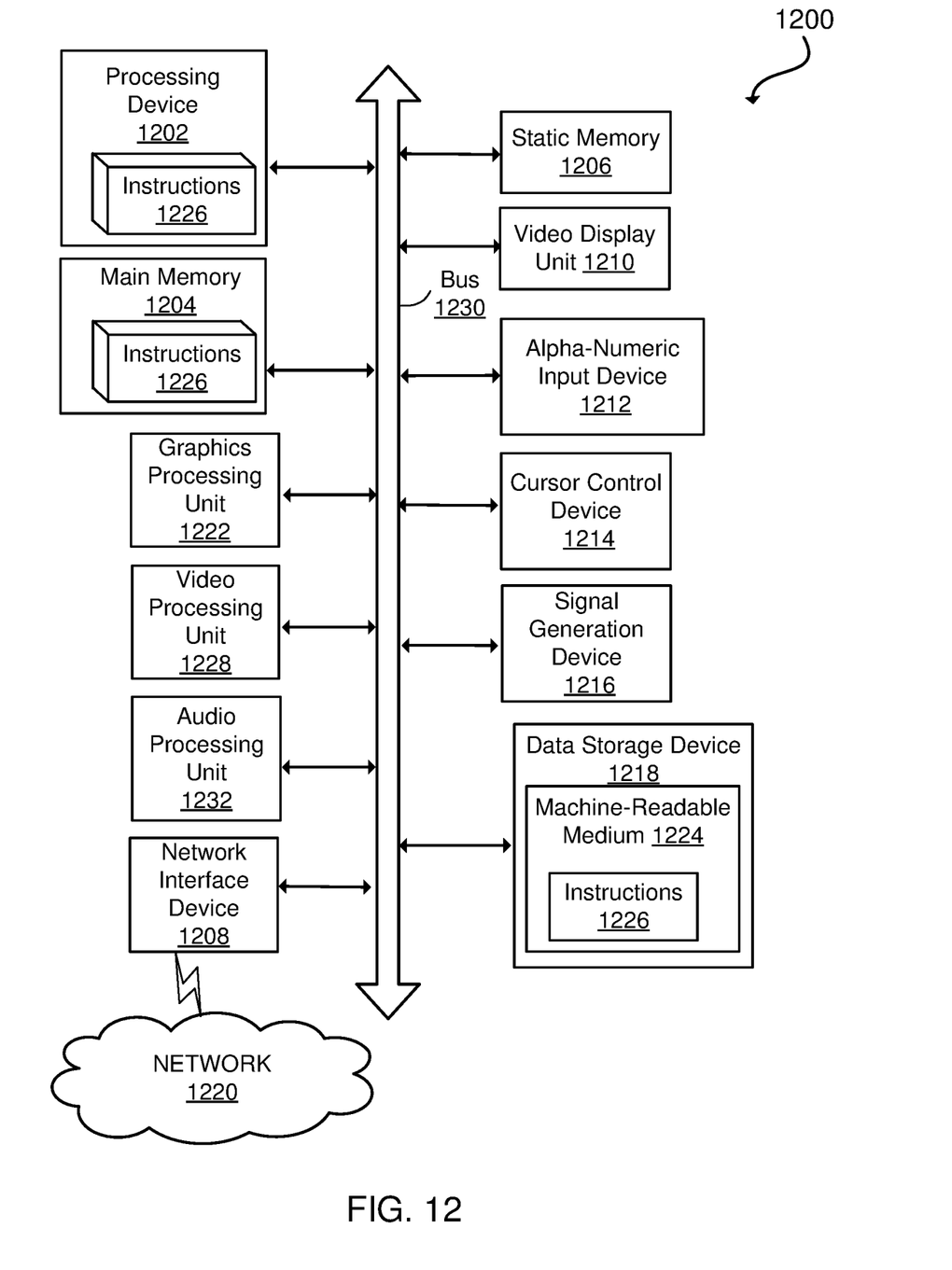
FIG. 12 depicts a diagram of an example computer system in which embodiments of the present disclosure may operate.

FIG. 12 illustrates an example machine of a computer system 1200 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1200 includes a processing device 1202, a main memory 1204 (e.g., read-only memory (ROM), flash memory, dynamic random access memory (DRAM) such as synchronous DRAM (SDRAM), a static memory 1206 (e.g., flash memory, static random access memory (SRAM), etc.), and a data storage device 1218, which communicate with each other via a bus 1230.

Processing device 1202 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1202 may also be one or more special-purpose processing devices such as an application specific integrated circuit (ASIC), a field programmable gate array (FPGA), a digital signal processor (DSP), network processor, or the like. The processing device 1202 may be configured to execute instructions 1226 for performing the operations and steps described herein.

The computer system 1200 may further include a network interface device 1208 to communicate over the network 1220. The computer system 1200 also may include a video display unit 1210 (e.g., a liquid crystal display (LCD) or a cathode ray tube (CRT)), an alphanumeric input device 1212 (e.g., a keyboard), a cursor control device 1214 (e.g., a mouse), a graphics processing unit 1222, a signal generation device 1216 (e.g., a speaker), graphics processing unit 1222, video processing unit 1228, and audio processing unit 1232.

The data storage device 1218 may include a machine-readable storage medium 1224 (also known as a non-transitory computer-readable medium) on which is stored one or more sets of instructions 1226 or software embodying any one or more of the methodologies or functions described herein. The instructions 1226 may also reside, completely or at least partially, within the main memory 1204 and/or within the processing device 1202 during execution thereof by the computer system 1200, the main memory 1204 and the processing device 1202 also constituting machine-readable storage media.

In some implementations, the instructions 1226 include instructions to implement functionality corresponding to the present disclosure. While the machine-readable storage medium 1224 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1202 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
    accessing a mask shape represented by a plurality of vertices connected by segments;
    receiving a correction of the mask shape comprising displacements of the segments and displacements of the vertices;
    modifying the mask shape by a processor, comprising:
        moving the segments according to the segment displacements, wherein moving the segments includes replicating vertices that are endpoints of the moved segments;
        collapsing the replicated vertices; and
        further moving the collapsed vertices according to the vertex displacements; and
    applying the modified mask shape to a mask synthesis process.

2. The method of claim 1 wherein replicating the vertices results in pairs of replicated vertices, and collapsing the replicated vertices comprises collapsing at least one of the pairs of replicated vertices to a midpoint between the pair of replicated vertices.

3. The method of claim 1 wherein replicating the vertices results in pairs of replicated vertices, and collapsing the replicated vertices comprises collapsing at least one of the pairs of replicated vertices to one of the replicated vertices in the pair.

4. The method of claim 1 wherein replicating the vertices results in pairs of replicated vertices, and collapsing the replicated vertices comprises collapsing at least one of the pairs of replicated vertices to a location along a bisector of an angle formed by the segments connecting to the vertex before replication.

5. The method of claim 1 wherein collapsing the replicated vertices comprises at least once collapsing the replicated vertices to an intersection of the displaced segments connecting to the vertex before replication.

6. The method of claim 1 wherein moving the segments and collapsing the replicated vertices comprises, for each segment to be moved:
    determining locations of the vertices that are endpoints of the moved segment after accounting for said moving and said collapsing; and
    moving said vertices to the determined locations.

7. The method of claim 1 wherein the mask shape has a same number of vertices after modification as before modification.

8. A system comprising a memory storing instructions; and a processor system, coupled with the memory and to execute the instructions, the instructions when executed cause the processor system to:
- predict a lithography result caused by a lithographic mask comprising mask shapes represented by pluralities of vertices connected by segments; and
- modify the mask shapes based on the predicted lithography result; comprising:
  - determining, based on the predicted lithography result, a correction of the mask shapes comprising displacements of the segments and displacements of the vertices;
  - moving the segments according to the segment displacements, wherein moving the segments includes replicating vertices that are endpoints of the moved segments;
  - collapsing the replicated vertices; and
  - further moving the collapsed vertices according to the vertex displacements; and
- iteratively repeat predicting the lithography result and modifying the mask shapes to achieve a desired lithography result.

9. The system of claim 8 wherein the lithography result comprises an aerial image or a resist pattern.

10. The system of claim 8 wherein modifying the mask shapes is based on reducing a difference between the predicted lithography result and a desired lithography result.

11. The system of claim 8 wherein the system is capable to handle Manhattan geometry mask shapes, crimped geometry mask shapes and any-angle geometry masked shapes.

12. The system of claim 8 wherein the mask shapes comprises curves defined by the vertices and segments.

13. The system of claim 8 wherein determining the correction of the mask shapes is based on a gradient of the lithography result with respect to the displacements of the segments and the displacements of the vertices.

14. The system of claim 8 wherein predicting the lithography result and modifying the mask shapes is performed in parallel for different mask shapes of the lithographic mask.

15. A non-transitory computer readable medium comprising stored instructions, which when executed by a processor, cause the processor to:
- access a mask shape represented by a plurality of vertices connected by segments;
- receive a correction of the mask shape comprising displacements of the segments and displacements of the vertices;
- modify the mask shape, comprising:
  - moving the segments according to the segment displacements wherein, after said movement, endpoint vertices of the moved segments are moved to collapsed vertices that are based on replicating the endpoint vertices and then collapsing the replicated vertices;
  - further moving the collapsed vertices according to the vertex displacements; and
- apply the modified mask shape to a mask synthesis process.

16. The computer readable medium of claim 15 wherein the displacements of the segments and the displacements of the vertices are along predetermined directions.

17. The computer readable medium of claim 16 wherein the displacements of the segments are along directions normal to the segments.

18. The computer readable medium of claim 16 wherein the displacements of the vertices are along bisectors of angles formed by the segments connecting to the vertices.

19. The computer readable medium of claim 16 wherein the displacements of the vertices are along directions defined by the moved segments.

20. The computer readable medium of claim 16 wherein the displacements of the vertices are along user-defined directions.

* * * * *